United States Patent [19]

Hanoka et al.

[11] Patent Number: 5,476,553
[45] Date of Patent: Dec. 19, 1995

[54] SOLAR CELL MODULES AND METHOD OF MAKING SAME

[75] Inventors: Jack I. Hanoka, Brookline, Mass.; Peter P. Klemchuk, Watertown, Conn.

[73] Assignee: ASE Americas, Inc., Billerica, Mass.

[21] Appl. No.: 198,485

[22] Filed: Feb. 18, 1994

[51] Int. Cl.$^6$ ............... H01L 31/048; H01L 31/18
[52] U.S. Cl. ............... 136/251; 136/259; 437/2; 437/207; 437/219; 156/99; 156/107; 156/285; 156/292; 156/307.1; 156/311
[58] Field of Search ............... 136/251, 259; 257/433, 788–790; 437/2–5, 207, 219; 156/99, 107, 285, 292, 307.1, 311

[56] References Cited

U.S. PATENT DOCUMENTS

| | | | |
|---|---|---|---|
| 4,239,555 | 12/1980 | Scharlack et al. | 136/251 |
| 4,241,493 | 12/1980 | Andrulitis et al. | 437/2 |
| 4,249,958 | 2/1981 | Baudin et al. | 136/251 |
| 4,451,969 | 6/1984 | Chaudhuri | 437/2 |
| 4,609,565 | 9/1986 | Yates | 437/2 |
| 4,692,557 | 9/1987 | Samuelson et al. | 136/251 |
| 4,751,191 | 6/1988 | Gonsiorawski et al. | 437/2 |
| 5,010,040 | 4/1991 | Vayman | 437/230 |
| 5,074,920 | 12/1991 | Gonsiorawski et al. | 136/244 |
| 5,110,369 | 5/1992 | Tornstrom et al. | 136/251 |
| 5,228,924 | 7/1993 | Barker et al. | 136/246 |
| 5,228,925 | 7/1993 | Nath et al. | 136/251 |

FOREIGN PATENT DOCUMENTS

| | | | |
|---|---|---|---|
| 58-17685 | 2/1983 | Japan | 136/251 |
| 59-16388 | 1/1984 | Japan | 136/251 |
| 2-94574 | 4/1990 | Japan | 136/251 |
| 2215129 | 12/1990 | United Kingdom | 437/2 |
| WO89/12321 | 12/1989 | WIPO | 437/2 |
| WO92/02952 | 2/1992 | WIPO | 437/2 |

OTHER PUBLICATIONS

3 M VHB Tapes, Typical Performance Characteristics published 1994, one page.
Baum & Binette, "Solar Collectors, Final Report", Springborn Laboratories, Inc., Contract No. AC04–78CS35359, Jun. 1983, pp. 3, 26, 32, 40 and 106.
Willis, "Investigation of Materials and Processes for Solar Cell Encapsulation, Final Report", Springborn Laboratories, Inc., DOE/JPL Contract No. 954527, Aug. 1986 pp. III–2, IV–3, IV–4.
Pern and Czanderna, "Characterization of ethylene vinyl acetate (EVA) encapsulant: Effects of thermal processing and weathering degradation on its discoloration", Solar Energy Materials and Solar Cells, 1992, pp. 13–18.
"Modern Plastics Encyclopedia '92" Oct. 1991, pp. 68 and 73.
Rees, "Ionic Bonding in Thermoplastic Resins", Dupont Innovations, 1971, pp. 1–4.
Rees, "Physical Properties and Structural Features of SURLYN® Ionomer Resins", Polyelectrolytes, 1976, pp. 177–197.
Powell, "SURLYN® Ionomer Resin: The Relationship between Polymer Structure and Commercial Applications", Polyelectrolytes, 1976, pp. 198–206.
Cyanamid, "CYASORB UV 5411, Technical Bulletin", 1990, pp. 1–6.
Cyanamid, "Plastics Additives Technical Bulletin: Cyasorb UV 3346 Light Stabilizer", pp. 1–7.
Union Carbide, "Organofunctional Silanes for Coatings", Product Information, 1991, pp. 1–3.
Osteholtz, "Modern Plastics Mid–October 1991 Encyclopedia"; Coupling Agents, Silanes, 1991, p. 160.
3M Corp., "Scotch™ VHB™ Joining Systems, Product Information", Dec. 1991, p. 1.

*Primary Examiner*—Aaron Weisstuch
*Attorney, Agent, or Firm*—Pandiscio & Pandiscio

[57] ABSTRACT

A photovoltaic solar cell module and method of manufacture is provided wherein an ionomer is used as an encapsulant, wherein said ionomer being modified by the presence of 0.3 to 2.0 wt. percent of a UV absorber and 0.3 to 2.0 wt. percent of a UV stabilizer.

18 Claims, 2 Drawing Sheets

SOLAR CELL MODULES AND METHOD OF MAKING SAME

FIELD OF THE INVENTION

This invention relates to the manufacture and construction of photovoltaic solar cell modules, and more particularly to the encapsulation of an interconnected multi-cell array of photovoltaic solar cells.

BACKGROUND OF THE INVENTION

Photovoltaic solar cells for directly converting radiant energy from the sun into electrical energy are well known. The manufacture of photovoltaic solar cells involves provision of semiconductor substrates in the form of sheets or wafers having a shallow p-n junction adjacent one surface thereof (commonly called the "front surface"). Such substrates may include an insulating anti-reflection ("AR") coating on their front surfaces, and are sometimes referred to as "solar cell wafers". The anti-reflection coating is transparent to solar radiation. In the case of silicon solar cells, the AR coating is often made of silicon nitride or an oxide of silicon or titanium.

A typical solar cell waver may take the form of a rectangular EFG-grown polycrystalline silicon substrate of p-type conductivity having a thickness in the range of 0.010 to 0.018 inches and a p-n junction located about 0.3–0.5 microns from its front surface, and also having a silicon nitride coating about 800 Angstroms thick covering its front surface. Equivalent solar cell wafers also are well known, e.g. circular or square single crystal silicon substrates and rectangular cast polycrystalline silicon substrates. Amorphous silicon solar cells and other thin film solar cells are also known equivalents contemplated by this invention.

The solar cell wafers are converted to finished solar cells by providing them with electrical contacts (sometimes referred to as "electrodes") on both the front and rear sides of the semiconductor substrate, so as to permit recovery of an electrical current from the cells when they are exposed to solar radiation. These contacts are typically made of aluminum, silver, nickel or other metal or metal alloy. A common preferred arrangement is to provide silicon solar cells with rear contacts made of aluminum and front contacts made of silver.

The contact on the front surface of the cell is generally in the form of a grid, comprising an array of narrow fingers and at least one elongate bus (also hereinafter called a "bus bar") that intersects the fingers. The width and number of the fingers and busses are selected so that the area of the front surface exposed to solar radiation is maximized. Further, to improve the conversion efficiency of the cell, an AR coating as described overlies and is bonded to those areas of the front surface of the cell that are not covered by the front contact.

The rear contact may cover the entire rear surface of the solar cell wafer, but more commonly it is formed so as to terminate close to but short of the edges of the blank. Aluminum is preferred for the rear contact for cost and other reasons. However, the exposed surface of an aluminum contact tends to oxidize in air, making it difficult to solder a wire lead to the contact. Therefore, to facilitate soldering, it has been found useful additionally to provide apertures in the aluminum coating, with silver soldering pads being formed in those apertures so as to slightly overlap the adjacent aluminum layer.

The silver soldering pads form ohmic bonds with the underlying substrate and also low resistance electrical connections with the aluminum contact, and are used as sites for making soldered connections to the rear contact. The silver soldering pads are considered to be an integral part of the rear contact. Such a contact arrangement is disclosed in PCT International Publication No. WO 92/02952, based on U.S. patent application Ser. No. 07/561,101, filed Sep. 1, 1990 by Frank Bottari et. al. for "Method Of Applying Metallized Contacts To A Solar Cell". An alternative but similar back contact arrangement wherein the aluminum coating has apertures filled with silver soldering pads involves having the aluminum overlap the edges of the silver soldering pads.

The grid-shaped contact and the AR coating on the front surface may be formed in various ways, as exemplified by U.S. Pat. Nos. 4,451,969, 4,609,565, 4,751,191, 5,010,040, 5,074,920, British Patent No. 2,215,129, and PCT International Application WO 89/12321, published 14 Dec. 1989.

Regardless of how the front grid contact and the AR coating are formed, at least a portion of each bus of the front contact is not covered with the AR coating, so as to permit making a soldered connection to that contact.

Photovoltaic solar cells (e.g., silicon solar cells) are typically small in size, e.g., 2–6 inches on a side in the case of cells made from rectangular EFG-grown substrates, with the result that their power output also is small. Hence, for convenience of construction and assembly, industry practice is to combine a plurality of cells so as to form a physically integrated module with a correspondingly greater power output. Several solar modules may be connected together to form a larger array with a correspondingly greater power output. The cells in a module are electrically connected in parallel and/or in series, and two or more modules in an array may be connected in series or in parallel, depending on the voltage and current output that is desired from the combined modules.

A usual practice is to form a module from two or more "strings" of silicon solar cells, with each string consisting of a straight row of cells connected in series, and the several strings being arranged physically in parallel with one another. The several strings are electrically connected to one another in parallel or in series, according to voltage and current requirements. A common practice is to use solder coated copper wire, preferably in the form of a flat ribbon, to interconnect a plurality of cells in a string, with each ribbon being soldered to the front or back contact of a particular cell, e.g., by means of a suitable solder paste as described in U.S. Pat. No. 5,074,920.

For various reasons including convenience of manufacture and assembly, cost control, and protection of the individual cells and their interconnections, it has been common practice to provide modules in the form of laminated structures. These laminated modules consist of front and back protective sheets, with at least the front sheet being made of clear glass or a suitable plastic material that is transparent to solar radiation, and the back sheet being made of the same or a different material as the front sheet. Disposed between the front and back sheets so as to form a sandwich arrangement are the solar cells and a polymer material that encapsulates the solar cells and is also bonded to the front and back sheets. The laminated sandwich-style module is designed to mechanically support the brittle silicon cells and also to protect the cells against environmental degradation.

Photovoltaic solar cell modules having an effective working life of 30 years or more have been a well known industry objective. The materials used in constructing modules are selected with concern for providing adequate resistance to damage from impact and physical and thermal shock, maximizing the amount of solar radiation received by the cells, avoiding short-circuiting and electrical leakage, and otherwise minimizing degradation from such environmental factors as moisture, temperature and ultra-violet sunlight-induced chemical reactions. Furthermore the thirty year useful life objective must be attainable at a commercially acceptable cost.

A particularly limiting factor in improving the useful life of solar cell modules has been the polymer materials used to encapsulate the cells. The tendency of the encapsulants to degrade under the influence of temperature and radiation has long been recognized as a critical problem. Thus prior to this invention, numerous materials were considered for use as encapsulants out of concern for increasing the useful life of solar modules. By way of example, a relatively large number of commercially available transparent polymer materials were surveyed and tabulated by B. Baum and M. Binette, in a 1983 report entitled "Solar Collectors" issued by Springborn Laboratories of Enfield, Conn. and describing an investigation conducted under Government Contract AC04-78CS35359. The polymers reviewed in that report covered a great variation in physical properties and chemistry. Among the polymer materials mentioned in the report were ethylene vinyl acetate copolymer (commonly known as "EVA") and ionomer. As a result of this investigation, twenty (20) transparent polymers were selected for possible use as encapsulants and/or glazings, and of these EVA was recommended as the best encapsulant. Ionomer was not included in the twenty polymers selected for possible use.

In a second Springborn Laboratories report entitled "Investigation of Materials and Processes for Solar Cell Encapsulation", published August 1986 under JPL Contract 954527 S/L Project 6072.1 and reported by Paul B. Willis, four polymer materials were identified as being superior to all other materials investigated for use as encapsulants in solar cell modules. The four materials selected by the researchers were ethylene vinyl acetate copolymer (EVA), ethylene-methyl acrylate (EMA), butyl acrylate syrup, and aliphatic urethane chemistry polymers. However, EVA was identified in the report as the material offering the best combination of processability, performance, and low cost.

As a result of investigations such as that reflected by the second Springborn report, EVA has received wide commercial acceptance as an encapsulant for solar cell modules. Unfortunately, EVA has been found to be a less than ideal solar cell encapsulating material. For example, a well known problem associated with the use of EVA as an encapsulant is the occurrence of progressive darkening of the EVA under intense sunlight. This discoloration can result in a greater than 30% loss in power output of the solar module after only four or more years of exposure to the environment. This phenomena is well documented. See, for example, the article written by F. J. Pern and A. W. Czanderna of the Applied Sciences Branch, National Renewal Energy Laboratory, Golden, Colo., entitled, "Characterization Of Ethylene Vinyl Acetate (EVA) Encapsulation: Effects of thermal processing and weathering degradation on its discoloration", Solar Energy Materials and Solar Cells 25 (1992) 3–23 North-Holland, Elsevier Science Publishers.

The discoloration, which often is a yellow-brown color, results from the EVA chemically degrading under the influence of ultraviolet light. As the EVA decomposes, it releases acetic acid, which in turn acts like a catalyst in the EVA to cause further degradation. It has also been found that the degradation of the EVA may be further accelerated by heat and/or the presence of oxygen.

A further problem attendant to use of EVA as an encapsulant is that it requires use of a cross-linking agent, e.g., an organic peroxide, to achieve its desired properties as an encapsulant. Cross-linking deprives the EVA of the ability to be remelted. Thus, it is not possible to delaminate a module by heating so as to enable the in-process reworking of the module. Additionally, it is believed that any unreacted organic peroxide in the cross-linked EVA encapsulant will further assist the degradation process.

U.S. Pat. Nos. 4,239,555; 4,692,557; and 5,110,369 disclose a variety of solar cell encapsulation methods and encapsulated photovoltaic solar cell modules. Details of the construction of these encapsulated solar cell modules and their associated methods of manufacture are provided in the above-identified patents, which patents are hereby incorporated herein by reference. All of the foregoing patents disclose encapsulating materials that suffer from one or more limitations.

More recently it has been discovered that the problems attendant with use of EVA as an encapsulant can be avoided by making solar cell modules using an ionomer as the encapsulant medium. That advance in the art is described and claimed in a copending U.S. application of Jack Hanoka for "Improvement In Solar Cell Modules And Method Of Making Same", Ser. No. 08/197,929, filed Feb. 17, 1994 (Attorney's Docket No. MTA-95).

OBJECTS AND SUMMARY OF THE INVENTION

The primary object of the present invention is to provide an improved photovoltaic solar cell module which employs ionomer as the cell encapsulant, with the ionomer being modified by the addition of additives which have the effect of improving the light transmission and stabilization properties of the ionomer so as to extend the effective useful life of the module.

Another object of the present invention is to provide an improved photovoltaic solar cell module capable of an increased working life without any substantial loss of power output.

Yet another object of the present invention is to provide an improved photovoltaic solar cell module that is characterized by an encapsulant that has a greater resistance to discoloration under intense sunlight than EVA.

Still another object is to provide a module of the type described wherein the solar cells are encapsulated in a thermoplastic light-transmitting material that is less expensive and has a greater resistance to discoloration than EVA.

These and other objects and advantages of the invention are achieved by providing a novel photovoltaic module comprising an array of electrically interconnected photovoltaic cells disposed in planar relationship between first and second sheets of a supporting material and encapsulated by a thermoplastic light-transmitting material in the form of an additive modified ionomer that is less expensive and has a greater resistance to discoloration than EVA. The module is fabricated by laminating together a sandwich comprising in stacked relation a first sheet of a relatively stiff supporting material, a first ionomer layer, a plurality of interconnected photovoltaic solar cells, a second ionomer layer, and a second sheet of supporting material, with at least one of the sheets of supporting material being transparent to solar radiation.

In the preferred embodiment of the present invention, the two sheets of supporting material are made of glass and the light-transmitting encapsulating material comprises a sodium ionomer containing selected additives as hereinafter described.

Other objects, features and advantages of the invention are set forth in the following detailed specification which is to be considered together with the accompanying drawings in which:

BRIEF DESCRIPTION OF THE DRAWINGS

Like numerals are used in the several figures to identify like components.

DETAILED DESCRIPTION OF THE PREFERRED EMBODIMENT

Figure 1:
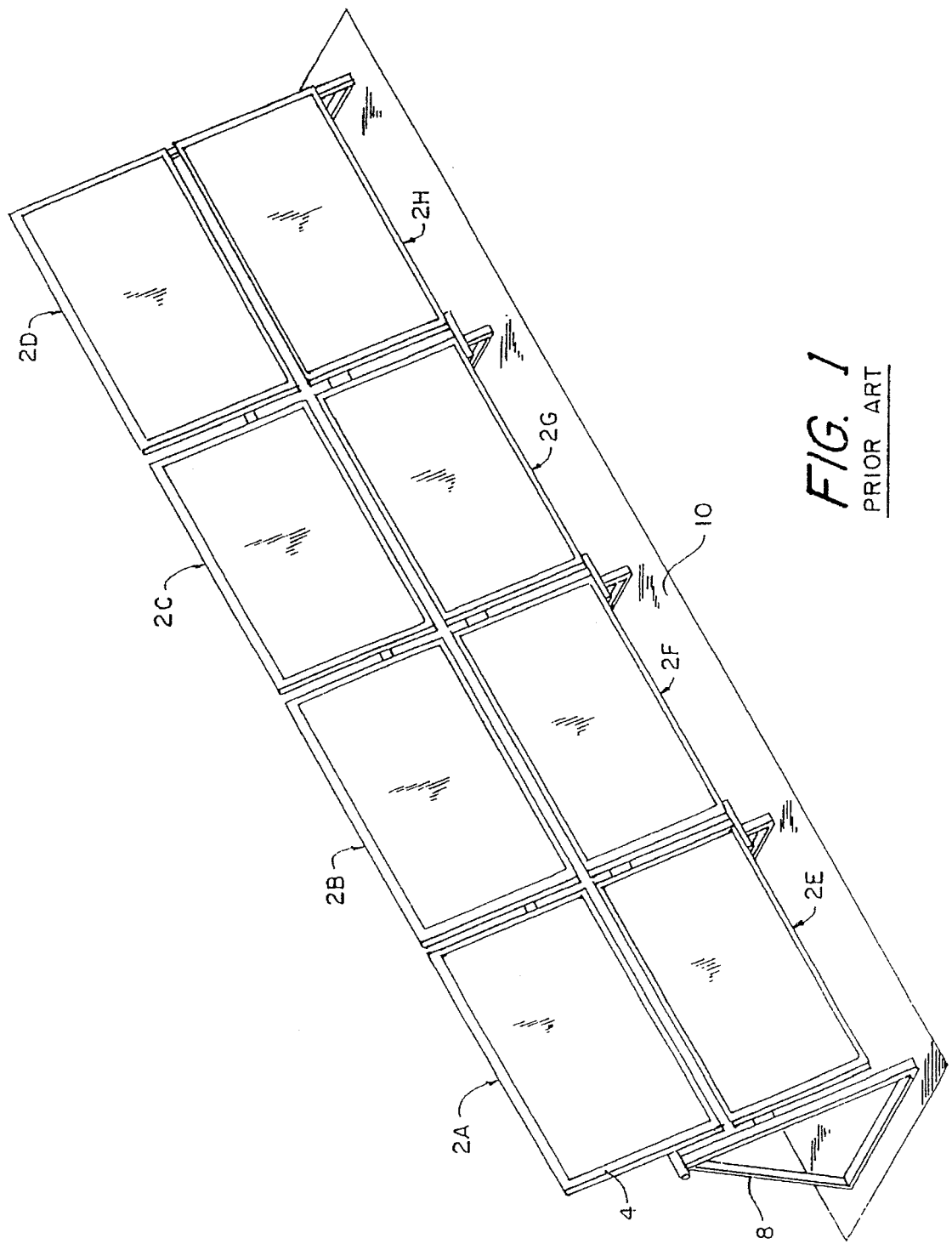
FIG. 1 is a front perspective view in elevation of a prior art photovoltaic solar energy collection and conversion array.

Referring now to FIG. 1 there is shown a solar panel assembly of a type known before the present invention. The solar panel assembly comprises a plurality of photovoltaic ("PV") modules 2A–2H which have metal frames 4 made of aluminum channel members and are attached to a metal support structure 8 which is secured to a suitable base 10, e.g., a base in the form of a flat roof or a concrete slab on the ground.

Each module comprises a plurality of photovoltaic cells (not shown) which are interconnected in series or in parallel by suitable conductors (also not shown), so that each module has a predetermined voltage and current output. Although not shown, it is to be understood that the electrically interconnected solar cells are terminated by electrical conductors (not shown) that extend outside of the module so as to permit connection to another module and/or an exterior circuit.

Although not shown, it is to be understood that each of the modules 2A–2H is a laminated structure which comprises (1) a top (front) protective support sheet in the form of a pane of glass, (2) a bottom (back) protective support sheet which may be made of a suitable insulating material, e.g., a synthetic material such as TEDLAR (Tedlar is the trade name for a polyvinyl fluoride polymer made by E. I. duPont de Nemeurs Co.), (3) a plurality of silicon solar cells interconnected in series or in parallel by suitable conductors so that the module will have a predetermined voltage and current output, and (4) a light transparent encapsulant in the form of EVA surrounding the cells and bonded to the top and bottom protective sheets. In forming the module, the EVA is provided in the form of two sheets, one disposed between the back protective sheet and the cells and the other disposed between the cells and the front protective sheet. In the lamination process (which involves heating under pressure in a vacuum laminator followed by cooling) the two sheets of EVA are liquified enough to fill the voids between adjacent solar cells, and on cooling the two sheets are merged into a single cross-linked polymer layer in which the cells are encapsulated. Additionally the cooled EVA is bonded to the front and back protective sheets so as to form an integrated, unified structure.

Figure 2:
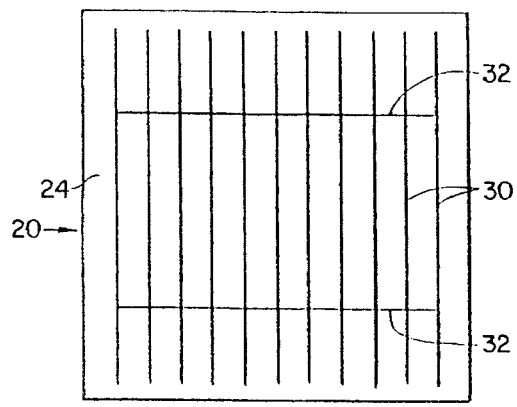
FIG. 2 is a front view of a well-known type of photovoltaic cell.
Figure 3:
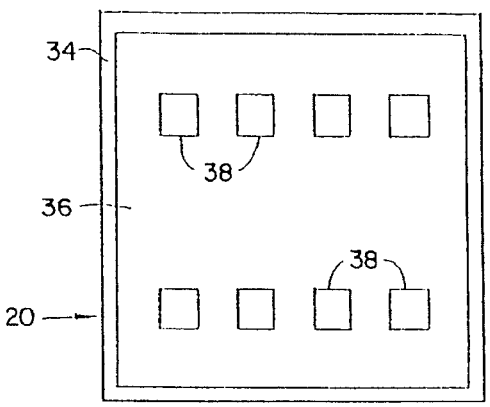
FIG. 3 is a rear view of the photovoltaic cell shown in FIG. 2.

FIGS. 2 and 3 illustrate a conventional solar cell 20 of a kind utilized in making modules of the type illustrated at 2A–2H in FIG. 1. Each cell comprises a silicon EFG-grown substrate in the form of a sheet or wafer that has been processed so as to have a shallow P-N junction (not shown) adjacent its front surface 24. Typically the junction is located between 0.3 and 0.5 microns below front surface 24. The cell also has on its front surface 24 a silver front contact in the form of a grid consisting of an array of narrow, elongate, parallel fingers 30 interconnected by two bus bars 32. Additionally, a thin silicon nitride anti-reflective coating (not shown) covers those portions of front surface 24 of the substrate that are not occupied by the grid electrode.

The rear surface 34 of cell 20 comprises a rear contact 36 (FIG. 3) that is made of aluminum metal and terminates short of the outer edges of the rectangular cell so as to have an uncoated margin portion that extends along each side of the cell substrate coextensive with the periphery of the substrate, and also two rows of silver metal soldering pads 38 that fill apertures formed in the rear aluminum contact and are fused to the underlying solar cell substrate. Pads 38 overlap rear contact 36 around the periphery of the apertures in that contact. Although FIG. 3 shows eight soldering pads, it is to be understood that the number and spacing of the soldering pads may be varied and is not critical to this invention. Solar cells 20 of the type shown in FIGS. 2 and 3 are well known and, for example, are disclosed by PCT International Publication No. WO 92/02952.

Figure 4:
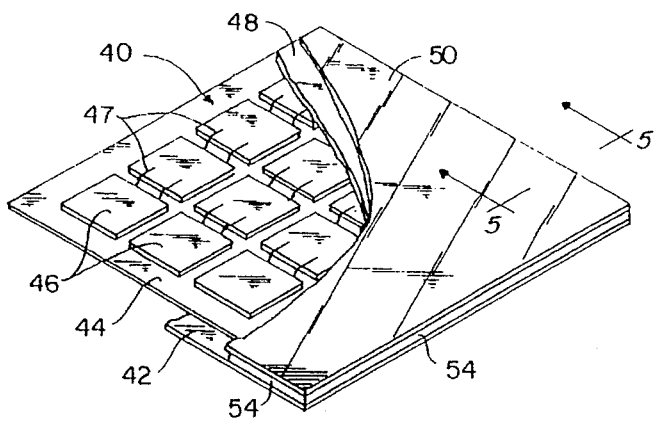
FIG. 4 is a fragmentary perspective view in elevation illustrating assembly of a solar module embodying the present invention.
Figure 5:
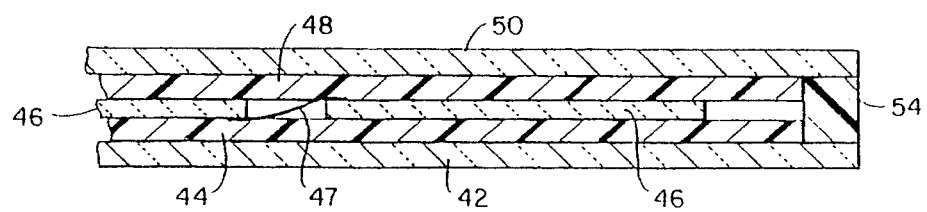
FIG. 5 is a cross-sectional view taken along line 5—5 in FIG. 4 showing the solar module of the present invention prior to lamination.
Figure 6:
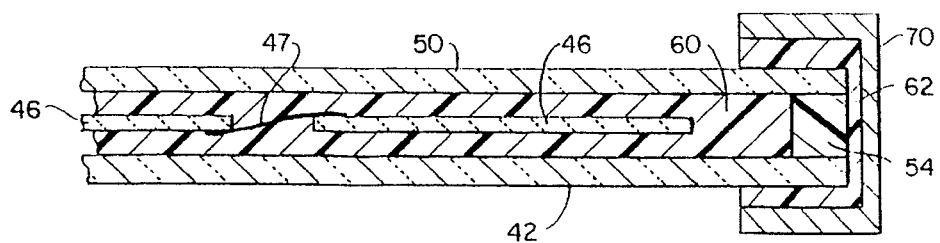
FIG. 6 is a cross-sectional view, similar to that shown in FIG. 5, showing the solar module of the present invention after lamination and framing.

FIGS. 4–6 illustrate construction of a module 40 which constitutes a preferred embodiment of the present invention. Module 40 is formed by laminating together a top (front) protective support sheet 42 of clear transparent glass, a first encapsulating layer 44 of an ionomer, an array of silicon solar cells 46 interconnected by ribbon-like conductors 47 in series or in parallel according to the output voltage and current requirements, a second encapsulating layer 48 of ionomer, a bottom (back) protective support sheet 50 made of glass. Each of the layers 44 and 48 may comprise one or more sheets of an ionomer, depending on the thickness in which ionomer sheets are available commercially. The ionomer comprises certain additives as are hereinafter described for extending the effective useful life of the module. The module also includes hermetic edge sealing means hereinafter described. Cells 46 are arranged in straight rows, i.e., strings, and an end cell in one string is connected to an adjacent string by conductors (not shown) similar to conductors 47, with the whole interconnected array having terminal leads (not shown) that extend out through an aperture in the back protective support sheet 50 or else through the edge sealing means.

As used herein the term "ionomer" means and denotes a thermoplastic resin containing both covalent and ionic bonds derived from ethylene copolymers. For the purposes of this invention, it is preferred to use ionomers formed by partial neutralization of ethylene-methacrylic acid copolymers or ethylene-acrylic acid copolymers with inorganic bases having cations of elements from Groups I, II or III of the Periodic table, notably, sodium, zinc, aluminum, lithium, magnesium and barium. The term "ionomer" and the resins identified thereby are well known in the art, as evidenced by Richard W. Rees, "Ionic Bonding In Thermoplastic Resins", DuPont Innovation, 1971, 2(2), pp. 1–4, and Richard W. Rees, "Physical Properties And Structural Features Of Surlyn Ionomer Resins", Polyelectrolytes, 1976, C, 177–197.

More preferably, for best results, it is preferred to use sodium-based ionomer resins, as the transparent layers. Zinc-based ionomers do not have light transmissibility as good as sodium-based ionomers, and hence it is preferred to limit the zinc-based ionomers to the back layer 48, especially where it is desired that layer 48 be white or translucent. Presently the best results are obtained by using the sodium based ionomer manufactured and sold by E. I. duPont de Nemeurs & Co., under the trade mark designation SURLYN 1601. That particular ionomer offers the advantages of excellent optical properties and high hot tack strength. Another ionomer product having excellent optical properties and useful in practicing the invention is duPont's Surlyn 1707.

Modules made with an ionomer as described above, e.g., with Surlyn 1601 have a superior effective working life than modules that employ EVA as an encapsulant. However, the present invention is based on and comprises the discovery that the addition of certain additivies will improve resistance of ionomer to degradation caused by UV radiation and thereby cause the module to have an effective working life approaching 30 years.

The invention involves combining the ionomer resin of choice with one or more selected additives designed to facilitate absorption of UV radiation and/or stabilize the ionomer against degradation induced by incident solar radiation. More specifically, the ionomer resin is modified by the addition of both a UV absorber and also a UV stabilizer in small amounts in the range of 0.3 to 2.0 wt. percent. The preferred additives are manufactured and sold by the Cyanamid Polymer Products Division of the American Cyanamid Corporation under the trade names Cyasorb 5411, a UVA absorbing agent, and Cyasorb 3346, a hindered amine light-stabilizer (HALS). Cyasorb 5411 is the tradename for 2-(2'-hydroxy-5'-tert-octylphenyl) benzotriazole; Cyasorb 3346 is the tradename for poly[(6-morpholino-s-triazine-2,4-diyl)] [(2,2,6,6-tetramethyl-4-piperidyl)imino] hexamethylene [(2,2,6,6-tetramethyl-4-piperidyl)imino]. These additives are added to the ionomer resin before the latter is converted into sheets for use as herein described. They have been found to be very effective in reducing the rate of light induced degradation of the ionomer encapsulant. For example, modules made using as the cell encapsulant sheets of SURLYN 1601 ionomer modified by addition of about 0.5 wt. percent Cyasorb 5411 and 0.5 wt % Cyasorb 3346 have demonstrated excellent UV-light stability characteristics in accelerated testing as compared to EVA.

Again referring to FIGS. 4–6, module 40 is constructed by first placing the top glass sheet 42 on a suitable support. Next, a first rectangular layer of an additive modified ionomer 44 of suitable thickness is placed in overlying relationship with glass sheet 42. Layer 44 is sized so that its outer edges are spaced from the corresponding edges of glass sheet 42. Ionomer layer 44 is positioned on glass plate 42 without the use of any adhesive since it will bond directly to the glass during processing, as will be hereinafter disclosed in further detail in connection with FIGS. 5 and 6. Preferably the inner facing surface of glass sheet 42 is coated with a film of a suitable liquid coupling agent to improve bonding of ionomer layer 44 to the glass during lamination.

It has been found that aminofunctional coupling agents, such as the one available from the Union Carbide Corporation under the tradename Organofunctional Silane A-1100, which is believed to be gamma-aminopropyltriethoxysilane, may be used to improve bonding of the ionomer to the surface of the glass pane. However, it should be understood that the method of the present invention may be practiced without using a coupling agent and still yield acceptable modules.

Next, an array consisting of several strings of photovoltaic solar cells 46 is placed in overlying relationship with first ionomer layer 44 in a desired pattern. The array of cells is provided with terminal leads (not shown) for connecting that array to another like module or to an exterior circuit. Preferably the cells are disposed with their grid contacts facing glass plate 42.

Then a sealing strip 54 is placed on glass sheet 42 so that it extends along the entire periphery of that sheet in surrounding relation to the ionomer layer 44. Strip 54 preferably has a rectangular cross-section and two of its opposite surfaces, i.e., the top and bottom surfaces shown in FIGS. 5 and 6, are coated with a pressure sensitive adhesive. Sealing strip 54 may be one continuous strip, but preferably it is made up of four pieces, each extending along a different edge of glass plate 42. In the preferred embodiment of the present invention, sealing strip 54 is an acrylic foamed tape, such as Scotch Brand VHB Double Coated Acrylic Foam Tape, manufactured by the 3M company of Minnesota.

Then, if the terminal leads of the array of cells are to be brought out through an edge of the module, the terminal leads (not shown) are positioned so that they extend through sealing strip 54.

Next, a second additive modified ionomer layer 48 similar in length and width to layer 44 is placed in overlying relationship with the interconnected solar cell array 46. As shown in FIG. 5, layers 44 and 48 extend beyond the periphery of array 46.

Still referring to FIG. 5, the sandwich used to make the module is completed by placing the back glass sheet 50 over the second ionomer layer 48 in alignment with the first (front) glass sheet 42. Like glass sheet 42, it is preferred that the inner facing surface of glass sheet 50 be coated with a suitable liquid coupling agent to improve bonding of that sheet to ionomer layer 48.

Then, unless the terminal leads of the solar cell have been positioned so as to project out from between sealing strip 54 and ionomer layer 48, the terminal leads are passed out through an opening or openings (not shown) in back sheet 50.

Thereafter the foregoing sandwich is heated to a temperature of about 170 degrees C. and held there long enough to cause the two ionomer layers 44 and 48 to soften enough to flow into encapsulating relation with each of the cells and the conductors 47 that connect the cells to one another. Preferably, the sandwich is heated up to about 170° to 180° C. within about 10 to 15 minutes and held there for between about 10 to 60 minutes, preferably for between about 10 to 20 minutes. During the heating, the layers of the sandwich are compressed together under a pressure not exceeding about 14 to 14.6 PSI. Thereafter, the pressure is relieved and the heating is terminated. The assembly is allowed to cool to ambient temperature, whereupon the ionomer solidifies and in so doing it bonds to the cells and the connecting conductors and also to the two glass plates. As seen in FIG. 6, the two additive modified ionomer sheets are fused together, forming a single encapsulating additive modified ionomer mass 60. The terminal leads (not shown) of the solar cell array are encased by ionomer where they pass out of the cooled module.

Once the lamination process has been completed a second adhesive coated sealing strip 62 is applied to the now laminated module 40 so as to cover the first sealing strip and overlap the margins of the exposed surfaces of the two glass plates. Preferably sealing strip 62 is made of the same material as sealing strip 54, but it is thinner and is oriented so that the adhesive on one side thereof engages the exposed surfaces of the glass sheets and the first sealing strip 54. Like sealing strip 54, the second sealing strip 62 may consist of several individual sections.

Finally a metal frame 70, preferably one made of a plurality of aluminum channel members, is applied in the manner shown in FIG. 6 to the four edges of the module.

By way of example, a solar cell module may be formed according to this invention by providing (a) two panes of 1/8" thick glass each measuring 50" wide and 74" long, (b) two layers of additive modified Surlyn 1601 ionomer having a thickness of 0.020", and (c) an array of silicon solar cells of the type illustrated in FIGS. 2 and 3. The Surlyn 1601 ionomer was modified by addition of 0.5 wt. percent Cyasorb 5411 and 0.5 wt. percent Cyasorb 3346. Each layer of additive modified ionomer may consist of two identical sized sheets each having a thickness of 0.010". Each ionomer layer is approximately 1" less in width and length than the glass panes. The array is made up of twelve strings of cells, with each string consisting of 18 cells connected in series. The strings are arranged in side-by-side relation and connected in parallel. A sandwich is formed in the manner described above in connection with FIGS. 4–6, with 3M "Scotch" brand VHB double-coated acrylic foam tape being used to form a sealing member corresponding to sealing strip 54 described above. The tape has a rectangular cross section and measures about 3/8" on each side. Before the sandwich is assembled, the surfaces of the glass which contact the ionomer sheets are washed and then coated with Union Carbide Organofunctional Silane A-1100 coupling agent and then dried.

This loose sandwich is then placed in a Spire Corporation SPI laminator Model 460, which is essentially a heated vacuum-type press. The laminator is closed and then simultaneously heat and vacuum are applied to the sandwich. The sandwich is brought up to a temperature of approximately 175° C., reaching that temperature in approximately ten minutes. The sandwich is then kept at that temperature for approximately another 15 minutes while under a pressure of about 14 pounds per square inch. The vacuum to the press is then released so as to remove the pressure on the sandwich and at about the same time the heaters of the press are deenergized to terminate active heating. The laminator is then opened and the laminated sandwich is allowed to cool to room temperature.

Thereafter, a strip of 3M Scotch brand VHB adhesive-coated acrylic foam tape measuring about 1/8" thick and about 1" wide is applied over the edge of the module to form a sealing member corresponding to sealing strip 62 described above. Finally an aluminum frame corresponding to frame 70 described above is applied to the module over sealing strip 62.

It is, of course, possible to modify the various components of the module described above without departing from the scope of the present invention. Thus, for example, other UV light absorbers and stabilizers may be used in place of Cyasorb 5411 and Cyasorb 3346.

Also, various types of solar cells known to persons skilled in the art, e.g., cells made from cast silicon substrates, may be used in this invention. Also the front and rear glass plates 42 and 50 may be replaced by a sheet of a suitable transparent plastic material, e.g., a polycarbonate or an acrylic polymer or a polyester such as polyethylene terephthalate ("PET"). Also the rear supporting sheet 50 may be made of a non-transparent material, e.g., a sheet comprising or consisting of Tedlar or some other material. However, best results are obtained when the front and back supporting sheets 42 and 50 are made of glass.

Also, the second ionomer layer 48 applied over the rear contacts of the cells need not be transparent. Instead, it may be translucent or white. It has been found that the use of translucent or white ionomer as a backing for silicon cells 20 tends to enhance the current output of the cells, since the non-transparent ionomer can reflect additional light passing between the cells back toward the front plate 42 for further reflection onto the active front surfaces of the silicon cells, thus increasing their efficiency.

It should be appreciated also that sealing strips 54 and 62 may be made of a material other than an acrylic foam, e.g., an adhesive-coated polyethylene tape, without departing from the scope of the present invention. However, the various alternative materials must be compatible with the ionomer. Also some other form of edge sealing means known to persons skilled in the art may be used in place of strips 54 and 62. It also is contemplated that strip 62 may be omitted depending on the nature of sealing member 54 or its replacement.

Another possible modification is to incorporate the silane coupling agent into the ionomer material.

Advantages of the Invention

The most important advantage of the present invention is that accelerated aging tests performed on modules encapsulated with an ionomer modified according to this invention have established a sound basis for estimating an effective working life approaching thirty years. That represents an unobvious improvement over modules made with EVA. The reasons for that improvement are evident from the other advantages hereinafter described.

Another advantage of the present invention over EVA encapsulated solar modules is the fact that ionomers do not require the addition of an organic peroxide cross-linking agent. Organic peroxide additives are required to be added to EVA resin in order to cause the EVA to undergo cross-linking when it is heated to form a laminated module as described above. The presence of the cross-linking agent reduces the shelf life of the EVA sheets and renders the shelf life light-and temperature-dependent, since evaporation of the cross-linking agent can be accelerated by an increase in temperature. Ionomer sheets modified according to this invention have a substantially longer shelf life than EVA since they do not employ any added cross-linking agent.

Still another advantage is that ionomers are not plagued with the release of by-product acetic acid as occurs when EVA undergoes degradation from the combined effects of heat and solar radiation. Accordingly, modules made with an ionomer encapsulant do not require a back support sheet having a finite porosity, e.g., Tedlar, so as to permit escape of any by-products released by the encapsulant. Tedlar is believed to be a polyvinyl fluoride polymer manufactured by the E. I. duPont de Nemours Corporation. Often, Tedlar is applied to the back of solar modules in the form of a laminated sheet of Tedlar and another polymer, such as a polyester. Acetic acid not only encourages degradation of the EVA but also acts to corrode the various metal contacts and electrical conductors associated with the photovoltaic solar cell array. Tedlar, due to its finite porosity, allows oxygen to enter the cell, thus promoting oxidation of the cells and the encapsulant. In contrast to EVA, ionomer has a relatively slow rate of degradation under the influence of heat and solar radiation; furthermore, as the ionomer degrades it produces $H_2O$ and $CO_2$ by-products, both of which are relatively benign agents in relation to the components of the solar cell module.

Yet another advantage of the present invention over EVA encapsulated solar modules is the fact that even allowing for the cost of introducing additives as provided by the invention, ionomer sheets are cheaper than sheets of EVA containing a cross-linking agent. Furthermore, because of the properties of the EVA and the organic peroxide added to it to foster cross-linking, EVA sheets are generally limited in width to approximately 18 inches, while ionomer sheet size is substantially unlimited. This advantage helps reduce labor costs in assembling the sandwich of components that are laminated to form solar modules.

Another important advantage of the present invention over EVA encapsulated solar cell modules is the fact that ionomer, with or without additives as provided by this invention, forms a cohesive bond with glass, metal and other materials while EVA bonds only adhesively to glass and hence does not form as strong a bond as an ionomer material. The stronger bond helps extend the effective working life of the modules and creates a better seal.

What is claimed is:

1. A laminated photovoltaic module comprising:
   first and second support sheets, at least said first sheet being made of a light-transparent material;
   an array of electrically interconnected photovoltaic cells disposed between said first and second support sheets;
   a mass of light-transmitting ionomer disposed between said first and second support sheets and encapsulating said cells; and
   at least one sealing strip disposed between said first and second support sheets adjacent to the edges thereof;
   said ionomer mass including 0.3 to 2.0 wt. percent of a UV absorber and 0.3 to 2.0 wt. percent of a UV stabilizer and being bonded to said support sheets, said cells and said at least one sealing strip.

2. A laminated photovoltaic module according to claim 1 wherein at least a portion of said mass is a sodium-based ionomer.

3. A laminated photovoltaic module according to claim 2 wherein the portion of said mass between said cells and said first support sheet is a sodium-based ionomer.

4. A laminated photovoltaic module according to claim 1 wherein said mass of light-transmitting ionomer is formed from at least two preformed sheets of ionomer, with one ionomer sheet being located between said cells and said first supporting sheet and another ionomer sheet being located between said cells and said second supporting sheet.

5. A laminated photovoltaic module according to claim 1 wherein said at least one sealing strip comprises a thermoplastic material.

6. A laminated photovoltaic module according to claim 5 wherein said at least one sealing strip comprises a deformable tape.

7. A laminated photovoltaic module according to claim 1 wherein said at least one sealing strip surrounds said mass of light-transmitting material and said cells.

8. A laminated photovoltaic module according to claim 1 wherein at least said first support sheet is a glass sheet.

9. A laminated photovoltaic module according to claim 1 wherein said at least one sealing strip before formation of said laminated photovoltaic module has a thickness in excess of the combined thicknesses of said at least two preformed sheets of ionomer and said cells.

10. A laminated photovoltaic module according to claim 1 wherein said UV absorber is Cyasorb 5411 and said UV stabilizer is Cyasorb 3346.

11. A laminated photovoltaic module according to claim 1 wherein said first and second support sheets are panes of glass.

12. A laminated photovoltaic module according to claim 11 wherein each of said cells has first and second surfaces facing said first and second support sheets respectively, a shallow P-N junction adjacent said first surface, a first contact bonded to selected portions of said first surface, and a second contact bonded to said second surface.

13. A laminated photovoltaic module according to claim 1 wherein each of said cells has first and second surfaces facing said first and second support sheets respectively, a shallow P-N junction adjacent said first surface, a first contact bonded to selected portions of said first surface, and a second contact bonded to said second surface.

14. A method of manufacturing a laminated photovoltaic module comprising the steps of:
   (a) providing one or more strings of electrically interconnected photovoltaic cells, each having a front light-receiving surface and a rear surface, with first and second contacts attached to said front and rear surfaces respectively;
   (b) providing first and second sheets of glass and first and second discrete sheets of ionomer, wherein said ionomer sheets have been modified by addition of 0.3 to 2.0 wt. percent of a UV absorber and 0.3 to 2.0 wt. percent of a UV stabilizer;
   (c) providing at least one deformable sealing strip;
   (d) placing said first ionomer sheet in overlying relation with one surface of said first sheet of glass;
   (e) engaging said one surface of said first sheet of glass with said sealing strip so that said sealing strip is positioned between the edge of said first sheet of glass and said first ionomer sheet;
   (f) placing said one or more strings of cells in overlying and contacting relation with said first ionomer sheet;
   (g) coverings in contacting relation said one or more strings of cells with said second ionomer sheet;
   (h) placing said second sheet of glass in overlying relation with said second ionomer sheet and said at least one deformable sealing strip;
   (i) placing the resulting assembly of cells, said at least one sealing strip, and said ionomer and glass sheets into a vacumm press and operating said press so as to evacuate air from said assembly and heat said assembly to a temperature at which said first and second ionomer sheets soften enough to flow and form a mass that encapsulates said cells; and
   (j) cooling said assembly so as to cause said ionomer to form a solid mass that is bonded to said first and second glass sheets, said at least one sealing strip, and said cells.

15. A method of manufacturing a laminated photovoltaic module comprising the steps of:
   (a) providing one or more strings of electrically interconnected photovoltaic cells, each cell having a front light-receiving surface and a rear surface and first and second contacts attached to said front and rear surfaces respectively;

(b) providing first and second sheets of glass and first and second discrete sheets of ionomer, wherein said ionomer sheets have been modified by addition of 0.3 to 2.0 wt. percent of a UV absorber and 0.3 to 2.0 wt. percent of a UV stabilizer;

(c) providing a deformable sealing strip having a thickness in excess of the combined thicknesses of said discrete sheets of ionomer and said cells;

(d) assembling the components of steps (a) to (c) so as to form a sandwich wherein said cells are disposed between and engaged by said ionomer sheets and said ionomer sheets are disposed between and engaged by said glass sheets, and said sealing strip is positioned between and engaged by said glass sheets and is in surrounding relation with said sheets of ionomer;

(e) compressing said sandwich and simultaneously heating said sandwich to a temperature of about 170° to 180° C. so as to cause said first and second ionomer sheets soften enough to flow into encapsulating relation with said cells; and (f) cooling said sandwich so as to cause said ionomer to solidify into a mass that is bonded to said first and second glass sheets, said strip, and said cells.

16. A preform sandwich adapted for forming a laminated photovoltaic module comprising:

first and second stiff support sheets, at least said first sheet being made of a light transparent material;

first and second performed discrete sheets of ionomer modified by addition of 0.3 to 2.0 wt. percent of a UV absorber and 0.3 to 2.0 wt. percent of a UV stabilizer, said first sheet of ionomer extending along and engaging an inner surface of said first support sheet, with said first sheet of ionomer terminating short of the edges of said first support sheet, said second sheet of ionomer extending along and engaging an inner surface of said second support sheet, with said second sheet of ionomer terminating short of the edges of said second support sheet; and an array of electrically interconnected photovoltaic cells disposed between and engaged by said first and second ionomer sheets.

17. A laminated photovoltaic module comprising:

first and second stiff support sheets, at least said first support sheet being made of a light-transparent material;

an array of electrically interconnected photovoltaic cells disposed between said first and second support sheets, said cells comprising a polycrystalline silicon substrate having first and second surfaces with said first surface facing said first support sheet, a shallow P-N junction adjacent said first surface, a first contact bonded to said first surface, and a rear contact bonded to said second surface; and a mass of light-transmitting ionomer disposed between said first and second support sheets and fully encapsulating said cells, said mass of light-transmitting ionomer being bonded directly to said support sheets and said cells and being modified by addition of 0.3 to 2.0 wt. percent of a UV absorber and 0.3 to 2.0 wt. percent of a UV stabilizer.

18. A laminated photovoltaic module according to claim 17 wherein said UV absorber is Cyasorb 5411 and said UV stabilizer is Cyasorb 3346.

* * * * *

UNITED STATES PATENT AND TRADEMARK OFFICE
CERTIFICATE OF CORRECTION

PATENT NO. : 5476553
DATED : December 19, 1995
INVENTOR(S) : Jack I. Hanoka et al It is certified that error appears in the above-indentified patent and that said Letters Patent is hereby corrected as shown below:

Claim 14, column 12, line 46, the word "coverings" should be changed to -- covering --.

Claim 14, column 12, line 53, the word "vacumm" should be changed to -- vacuum --.

Claim 15, column 13, line 21, the word "to" should be inserted before the word "soften".

Signed and Sealed this

Sixteenth Day of April, 1996

Attest:

BRUCE LEHMAN

Attesting Officer

Commissioner of Patents and Trademarks